United States Patent [19]

Mayumi

[11] 4,431,926
[45] Feb. 14, 1984

[54] COUNTER CONTROLLED SIGNAL GENERATOR

[75] Inventor: Hiroshi Mayumi, Tokyo, Japan

[73] Assignee: Nippon Electric Co., Ltd., Tokyo, Japan

[21] Appl. No.: 331,744

[22] Filed: Dec. 17, 1981

Related U.S. Application Data

[63] Continuation of Ser. No. 41,973, May 23, 1979, abandoned.

[30] Foreign Application Priority Data

May 24, 1978 [JP] Japan .................................. 53-62671

[51] Int. Cl.³ ...................... H03K 6/00; H03K 21/16; H03K 25/00
[52] U.S. Cl. ...................................... 307/260; 377/94; 377/114; 377/81
[58] Field of Search ............... 307/205, 223 R, 224 R, 307/226 R, 41, 42; 328/48, 105, 106; 40/825, 65, 69; 365/231-236, 239, 246; 377/64, 71, 73, 75, 81, 94, 114

[56] References Cited

U.S. PATENT DOCUMENTS

| | | | |
|---|---|---|---|
| 2,964,657 | 12/1960 | Page | 340/825.65 |
| 3,530,434 | 9/1970 | Stites et al. | 340/825.65 |
| 3,566,153 | 2/1971 | Spencer, Jr. | 307/205 |
| 3,631,407 | 12/1971 | Cotter | 307/205 |
| 3,671,875 | 6/1972 | Pento | 328/44 |
| 3,893,088 | 7/1975 | Bell | 365/231 |
| 4,032,894 | 6/1977 | Williams | 307/205 |
| 4,221,001 | 9/1980 | Heeren | 307/223 R |

*Primary Examiner*—Larry N. Anagnos
*Assistant Examiner*—B. P. Davis
*Attorney, Agent, or Firm*—Sughrue, Mion, Zinn, Macpeak and Seas

[57] ABSTRACT

A signal generator which may be fabricated as monolithic integrated circuit is disclosed. The signal generator includes a counter having a plurality of stages and providing parallel outputs and a plurality of flip-flops. A programmable logic array capable of functioning as AND and OR logic and composed of a matrix arrangement of programmable elements receives as inputs the parallel outputs of the counter and provides inputs to the flip-flops to generate signals at the outputs of the flip-flops.

10 Claims, 7 Drawing Figures

PRIOR ART

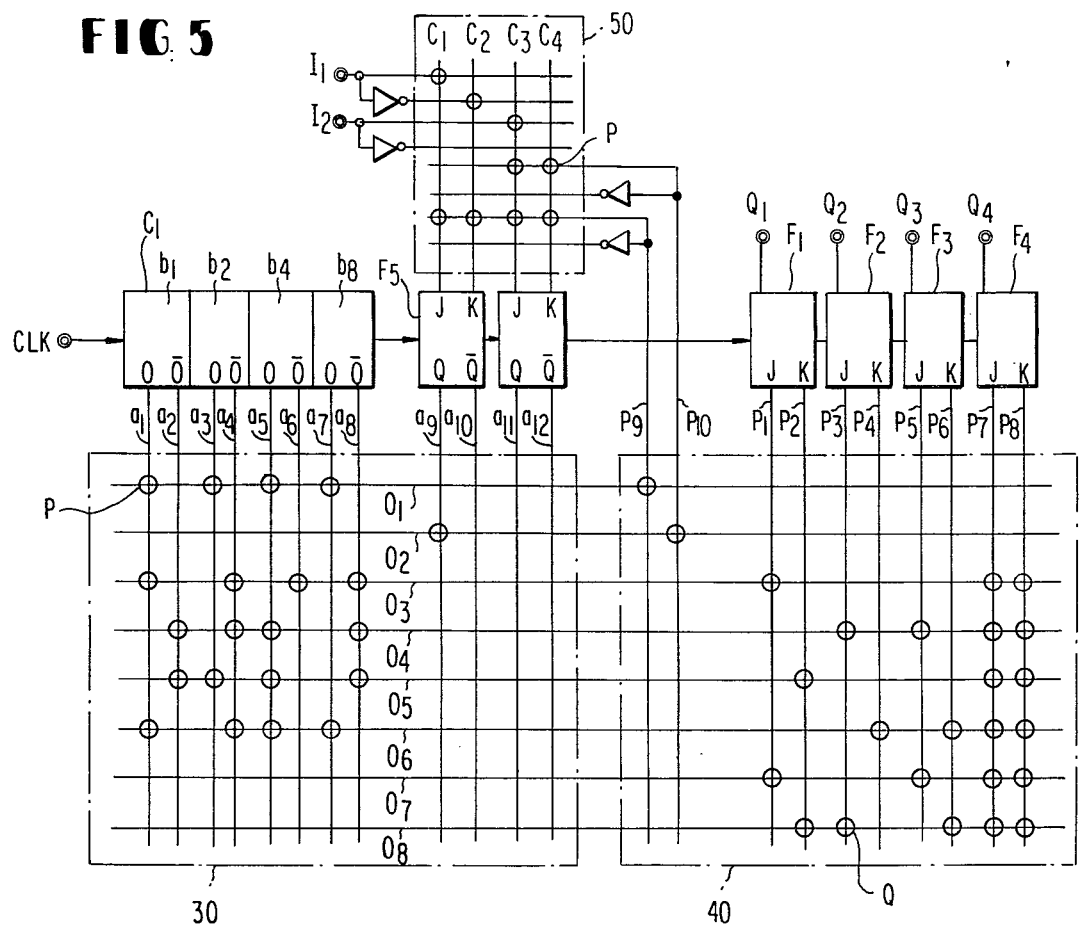
FIG. 5
FIG. 4
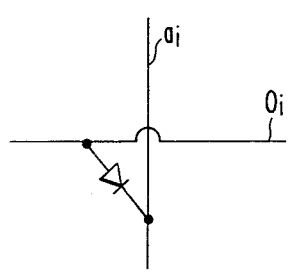
(a)
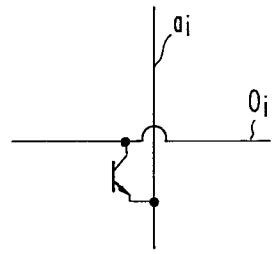
(b)
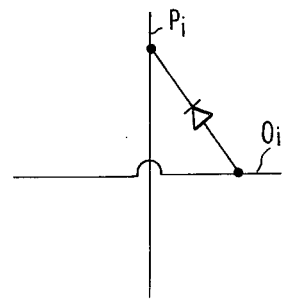
(c)

COUNTER CONTROLLED SIGNAL GENERATOR

This is a continuation of application Ser. No. 41,973, filed May 23, 1979, now abandoned.

BACKGROUND OF THE INVENTION

The invention relates to a signal generator and, more particularly, to a control signal generator which is fabricated as a monolithic integrated circuit using a programmable logic array (hereinafter abbreviated to as PLA).

An electronic device such as a memory device, for example, a magnetic bubble memory device or a semiconductor memory device, an information processor or the like, requires control signals providing a series of predetermined logic changes. The control signal of this type is formed by applying parallel output signals from a counter into gate circuits so as to have a given level for each time slot. This method, therefore, needs a number of gate circuits, thus encumbering the minimization of the device. In recent years, a single electronic device needs a number of such control signals. Accordingly, the provision of a number of gate circuits is a serious problem. Recently, an AND-OR type PLA including an AND logic array and an OR logic array or a general purpose PLA including the AND-OR array and an internal feedback loop by flip-flops are preferably used for fabricating a random logic by LSI technology, as disclosed in U.S. Pat. No. 3,566,153. In such a PLA, however, a major part of the regions of the AND or OR arrays, that is to say, storing elements, are not used for a specific purpose so that the use of the array is very inefficient. For example, in a circuit where the parallel output signals from the binary counter are subjected to a programmable logic and flip-flops are driven by the logic outputs, the flip-flops produce timing wave forms, each of which is operable in a proper time slot. Therefore, it is suitable for a timing signal generator. When this is realized by using the general purpose PLA, the internal feedback flip-flops must be used for the respective bits and the output flip-flops of the binary counter, and most of the AND and OR arrays are not used. This is very inefficient.

SUMMARY OF THE INVENTION

Accordingly, an object of the invention is to provide a control signal generator which can be minimized in size.

Another object of the invention is to provide a PLA which is suitable for a programmable control signal generator of which the timing wave forms may be controlled from the exterior depending on control inputs and states of the internal flip-flops at that time.

A signal generator according to the present invention comprises a counter having a plurality of bit stages, each of the bit stages having an output, preferably a true output and a complement output, at least a logic array having a plurality of inputs coupled to the outputs of the bit stages in the counter and at least a flip-flop having an input coupled to the output of the logic array, wherein at least a signal having a predetermined wave form usable as a control signal or a timing signal is derived from the output of the flip-flop. In such a generator, a counter counting a predetermined clock signal or a counter counting an arbitrary input signal applied from the exterior may be used as the above counter.

According to the invention, there is provided a control signal generator comprising at least one array (referred to as a "basic array") capable of functioning as AND or OR logic which is a matrix arrangment of programmable elements wired with columns as outputs and rows as inputs, a binary counter of a plurality of bits for providing parallel outputs, and a plurality of flip-flops, wherein the parallel outputs of the counter are used as at least a part of the inputs of the basic array, and at least a part of the outputs of the same or another basic array is used as inputs to the flip-flops.

According to another aspect of the invention, the above control signal generator further includes a plurality of flip-flops of which the outputs are used as a part of the inputs of the basic array and a part of the outputs of the same or another basic array is used as all or a part of the inputs of the flip-flops.

According to still another aspect of the present invention, the above control signal generator further includes the combination of 2 bits of the parallel, complementary outputs of the binary counter and the complementary outputs of the flip-flops to the input of the basic array, through a 2-bit decoder.

Additionally, there is provided a programmable control signal generator which is provided with programmable circuits for the respective basic arrays in a monolithic integrated circuit in which programmable elements are field-programmable, that is to say, it is programmable by using the external terminals, after the monolithic integrated circuit is fabricated.

BRIEF DESCRIPTION OF THE DRAWINGS

Other objects and features of the invention will be apparent from the following description taken in connection with the accompanying drawings, in which:

FIG. 4 schematically illustrates program elements, in which FIG. 4(a) is a circuit diagram showing a programmed state of an AND array, and FIGS. 4(b) and 4(c) are a circuit diagram showing a non-programmed state in the AND and a circuit diagram showning a programmed state of an OR array, respectively;

FIG. 5 shows a block diagram of a second embodiment of a control signal generator according to the invention;

DETAILED DESCRIPTION OF THE PREFERRED EMBODIMENTS

Figure 1:
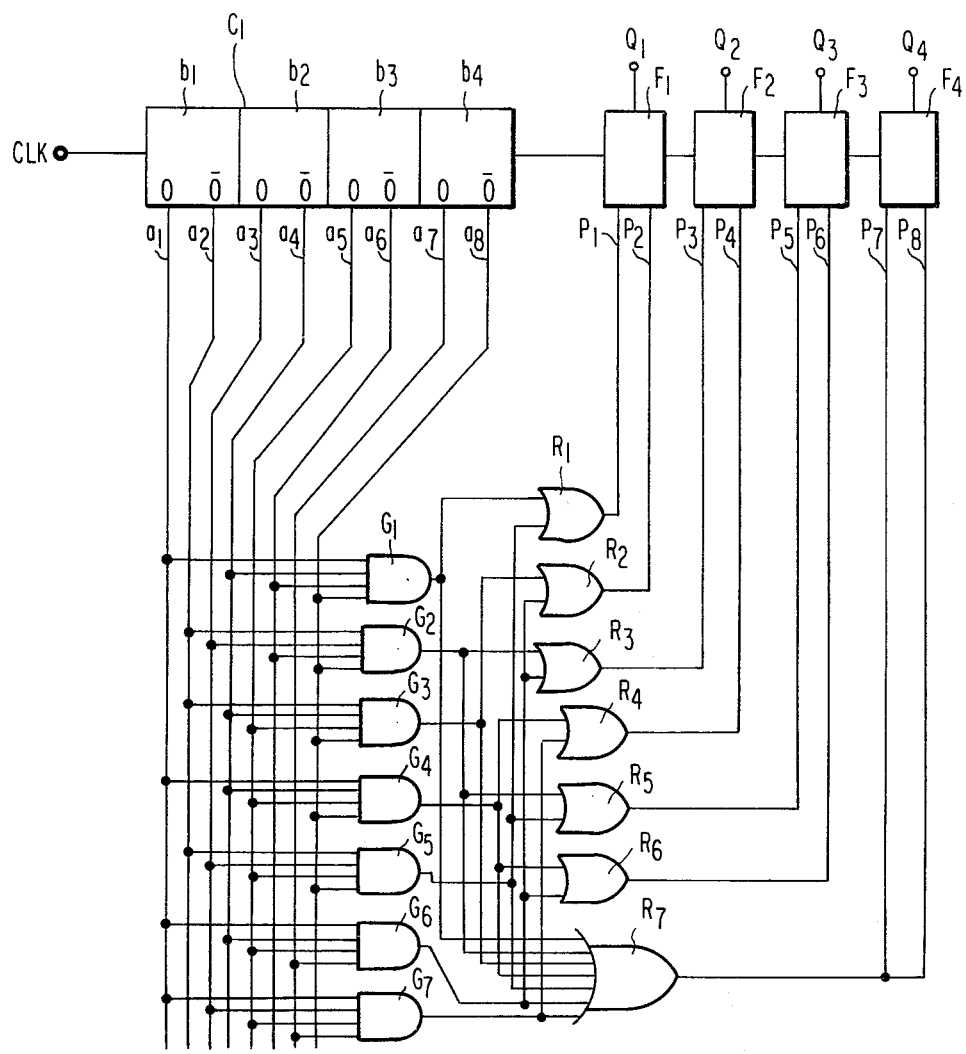
FIG. 1 shows a block diagram of a conventional control signal generator.

For a better understanding of the invention, reference is first made to FIG. 1 illustrating a conventional control signal generator. Parallel output true and complement signals a1 to a8 from a 4-bit counter C1 having bit stages b1, b2, b4 and b8 which are weighted by 1, 2, 4 and 8 respectively, which counter receives a clock signal CLK for counting, are selectively applied to AND gates G1 to G7. The output signals from the AND gates G1 to G7 are selectively combined to be applied to the inputs of OR gates R1 to R7. The output signals from the OR gates R1 to R7 are selectively applied to the J-inputs and K-inputs of J-K flip-flops F1 to F4 which are controlled by the clock signal CLK. The control signal generating circuit thus constructed detects given time slots to set states of the flip-flops F1 to F4 by the AND gates G1 to G7, and applies the detected outputs to the J- and K-input terminals, through the OR gates. In such a control signal generator, it is possible to readily form any wave shapes through the design of a logic gate. In this case, however, when the number of fan-outs of the logic gates increases and the number of the bit stages in the counter increases, the level of the output waveform changes greatly and in a complicated manner. Accordingly, the system which is a combination of unit logic circuits encounters a great increase of the number of logic elements. This leads to an increase of power consumption and greatly increased amount of wiring from the counter as well. Therefore, whenever it is required to change the design of the output wave shapes, the circuit must be redesigned from the stage of the integrated circuit.

Figure 2:
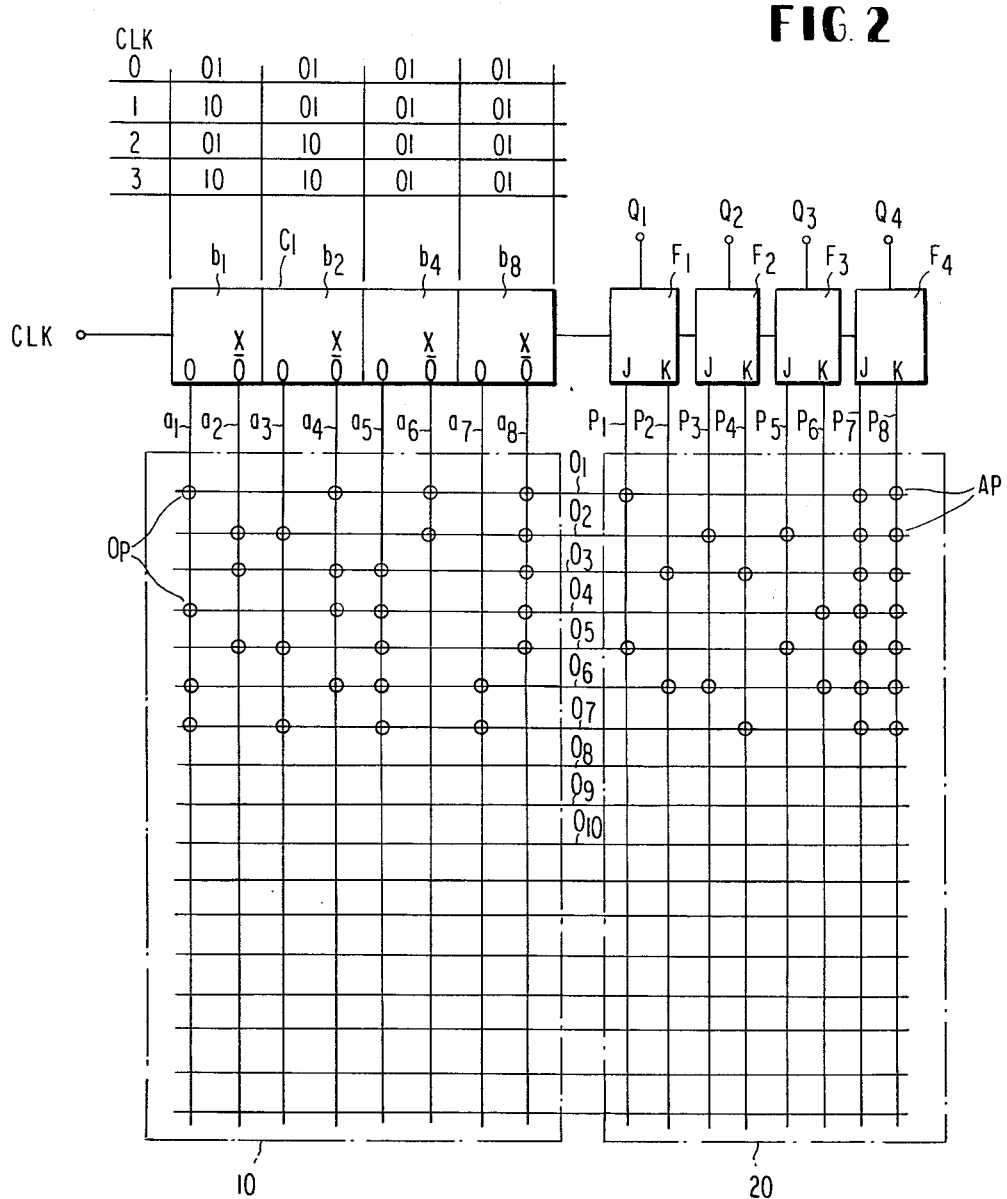
FIG. 2 shows a block diagram of an embodiment of a control signal generator according to the invention.
Figure 3:
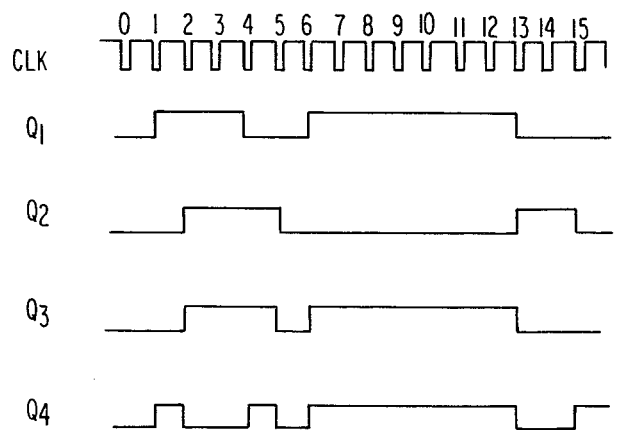
FIG. 3 shows a set of timing diagrams useful in explaining the operation of the generator shown in FIG. 2.

An embodiment of a control signal generator according to the invention will be described with reference to FIGS. 2 to 4. As shown, in an AND array 10, eight input lines a1 to a8 cross eight product term lines 01 to 08 to form a matrix at which the cross-points have programmable logic elements. The logic elements OP indicated by circles (o) are programmed in a conductive state, as shown in FIG. 4(a) wherein lines ai and 0i to one of input lines a1 to a8 and one of product term lines 01 to 08, respectively, while the remaining elements not circled are programmed in an open state, as shown in FIG. 4(b). The eight product term lines 01 to 08 extend into input lines to an OR array 20 where those input lines cross eight output lines P1 to P8 as sum term lines. Also in the OR array 20, the individual cross points AP marked by circles are programmed, as in the case of the AND array 10, while the remaining cross points not marked are not programmed and remain in an open state. The programming is made as shown in FIG. 4(c). As a matter of course, the product term lines 01 to 08 and the output lines P1 to P8 are biased to logical "1" through load elements (not shown). The clock signal CLK drives the counter C1 having four bit stages b1, b2, b4 and b8. The outputs O and $\overline{O}$ of each bit stage weighted 1, 2, 4 and 8 are coupled with the input lines a1 to a8 of the AND array 10. The four J-K flip-flops F1 to F4 are coupled at the J- and K-inputs with the output lines P1 to P8 of the OR array 20, as shown in the figure. Those flip-flops are controlled by the clock signal CLK, with the outputs Q1 to Q4 serving as the outputs of the control signal generator. The clock signal for controlling the flip-flops may differ from one for controlling the counter C1.

The operation of the embodiment will be described referring to FIG. 3 and particularly to the output Q1 of the J-K flip-flop F1. When the output of the counter C1 is "1," that is to say, the input lines a1 to a8 are "1," "0," "0," "1," "0," "1," "0" and "1" respectively, the product term line 01 is active in level to activate the output p1 of the OR array 20 and then to drive the J-input of the flip-flop F1 thereby rendering the output Q1 to be high. Then, when the counter output of the counter C1 becomes 4, that is to say, the input lines a1 to a8 are "0," "0," "1," "1," "1," "0," "0," and "1" respectively, the K input of the flip-flop F1 is driven so that the output Q1 becomes low. Similarly, when the count of the counter C1 becomes 6, the J input is driven to make the output Q1 high. When the count of the counter C1 becomes 13, the K input is driven to that the output Q1 becomes low. Thus, the control signal for the time slots of $2^4=16$ is obtained. This operation is correspondingly applied for the outputs Q2 to Q4. As easily seen, if the unprogrammed areas of the AND array and the OR array are properly programmed, more complicated waveforms are obtained.

Figure 6:
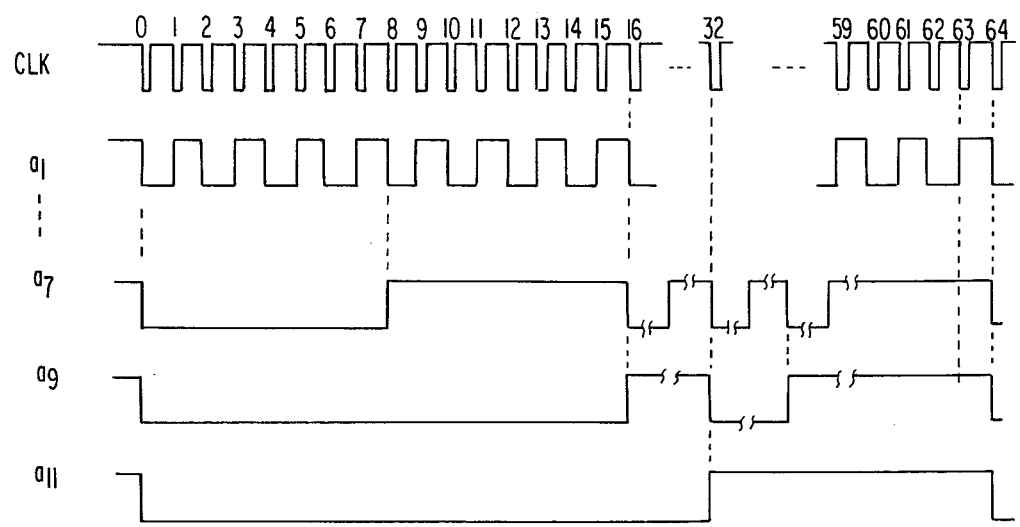
FIG. 6 shows a timing chart useful in explaining an operation of the device shown in FIG. 5.
Figure 7:
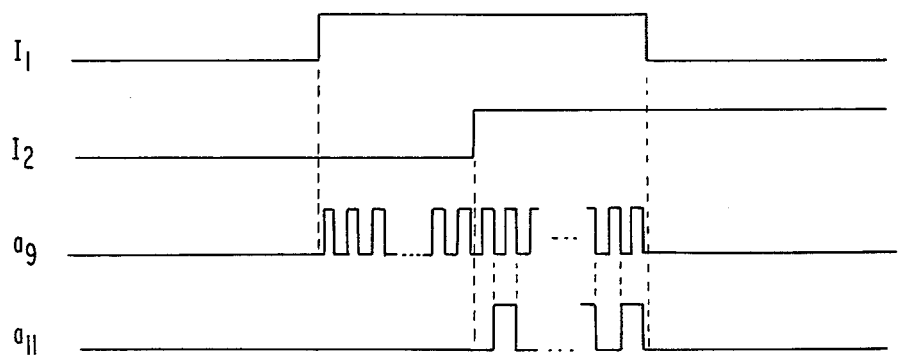
FIG. 7 shows a timing chart for illustrating another operation of the device shown in FIG. 5.

The second embodiment of the control signal generator according to the invention will be described with reference to FIGS. 5 to 7. As shown in FIG. 5, an AND array 30 is provided with twelve input lines a1 to a12 of which the input lines a1 to a8 are coupled with the outputs of a 4-bit counter C1 and the input lines a9 to a12 with the true and complement outputs Q and $\overline{Q}$ of two J-K flip-flops f5 and F6. An OR array 40 is provided with ten output lines P1 to P10 of which the output lines P1 to P8 are coupled with the J- and K-inputs of four J-K flip-flops F1 to F4, as in the embodiment shown in FIG. 1, and the output lines P9 and P10 for providing true and complement signals coupled with a control AND array 50 through inverters with the AND array 50. The AND array 50 is coupled with input terminals I1 and I2 through which it receives true signals. The outputs of the AND array 50 are supplied to the J- and K-inputs of the flip-flops F5 and F6.

The operation of the embodiment mentioned above will be described. When the counter C1 is counting from 0 to 15, the outputs Q1 to Q4 are essentially the same as those of the embodiment shown in FIG. 2, because the programming of the product term lines $0_3$ to $0_9$ is the same as that of the lines $0_1$ to $0_7$ in FIG. 2. When the control terminals I1 and I2 are in logical "1" level and the counter C1 fully counts with the input lines a1 to a8 being "1," "0," "1," "0," "1," "0," "1," and "0," respectively, the product term line 01 and the output line P9 are in "1" level and the product term lines $C_1$ and $C_2$ of the AND array 50 are in "1" level. As a result, the flip-flop F5 is toggled so that the output Q becomes logical "1." At the following full count of the counter C1, the output lines P9 and P10 are "1" in logical level and the product term lines $C_3$ and $C_4$ are "1" so that the flip-flop F6 is toggled to have "1" at the output Q. In this manner, the flip-flops F5 and F6 may be operated as a counter with 16 and 32 weights. Therefore, the timing outputs Q1 to Q4 may be programmed over 64 time slots in response to the input lines a1 to a12 as shown in FIG. 6. If the control input terminal I1 is brought to "0," the flip-flop F5 may be locked in operation. If the control input terminal I2 is brought to "0," the flip-flop F2 may be locked. This operation is well illustrated in the Figure.

As described above, the condition at the control input terminals I1 and I2 may control the flip-flops F5 and F6 independently of the stepping operation from the counter C1 or in harmony with the counter C1.

It should be understood that the invention is not limited to the above-mentioned embodiments but is applicable for a logic array including any type of array on such one that uses insulated-gate field-effect transistors shown for example in U.S. Pat. No. 3,566,153.

What is claimed is:

1. An integrated circuit comprising a single control terminal receiving a single train of control signals, counter means having a plurality of bit stages, each of said bit stages having true and complement outputs, said counter means counting said single train of control signals applied through said single control terminal, a programmable AND logic array having a plurality of inputs coupled to said outputs of said counter and a plurality of product term lines, a programmable OR logic array having a plurality of inputs coupled to said product term lines and a plurality of sum term lines, and a plurality of flip-flops having inputs coupled to said sum term lines, wherein a plurality of different output signals are simultaneously derived from the outputs of said flip-flops in synchronism with said control signals.

2. A signal generator comprising a control terminal receiving a pulse signal, a counter having a plurality of stages and providing parallel outputs by counting a single train of pulse signals applied through said control terminal, a plurality of flip-flops and a programmable logic array capable of functioning as AND and OR logic and composed of a matrix arrangement of programmable elements, said parallel outputs being connected as inputs to said programmable logic array and said logic array providing inputs to said flip-flops to simultaneously generate a plurality of different signals in synchronism with said pulse signals at the outputs of said flip flops.

3. A signal generator as recited in claim 2, wherein said programmable elements are diodes connected between selected row and column wires in said matrix.

4. A signal generator as recited in claim 2, further comprising a second plurality of flip-flops the outputs of which are connected as inputs to said programmable logic array, decoder means connected to receive inputs from said programmable array and external inputs for providing inputs to said second plurality of flip-flops.

5. A signal generator as recited in claim 4, wherein said decoder means is a second programmable logic array capable of functioning as AND logic and composed of a matrix arrangement of programmable elements.

6. A signal generator comprising a clock input terminal receiving a single train of clock signals, a counter composed of a plurality of bit stages for counting said single train of clock signals, said counter having a count capacity more than the number of said bit stages, a logic array including a plurality of first lines, a plurality of second lines intersecting with said first lines, and a plurality of program elements disposed at desired intersections of said first and second lines, means for connecting each of said first lines to associated output terminals of said stages of said stages of said counter, locations of said program elements associated with the respective first lines being different, an OR logic array including a plurality of third lines connected to said second lines, a plurality of fourth lines intersecting said third lines and a plurality of additional program elements disposed at desired intersections of said third and fourth lines, a plurality of flip-flops, means for connecting each of said fourth lines to associated input terminals of said flip-flops, locations of the additional program elements associated with the respective third lines being different from each other, and a plurality of output terminals connected to the respective output terminals of said flip-flops, whereby a plurality of signal trains of different patterns are simultaneously derived through said plurality of output terminals in response to said single train of clock signals.

7. The signal generator according to claim 6, wherein said logic array includes a plurality of bipolar transistors in a matrix form.

8. A signal generator comprising a control terminal receiving a train of pulse signals, a counter having a plurality of bit stages, each of said bit stages having true and complement outputs, means for connecting an input terminal of said counter to said control terminal, an array of a plurality of programmable elements arranged in a matrix form, and having a plurality of input terminals and a plurality of output terminals each of the output terminals of said array outputting a series of logic outputs as results of logic operations based on at least one of AND and OR logic functions with respect to signals applied to input terminals thereof, means for supplying the input terminals of said array with the true and complement output signals of said counter, a plurality of flip-flops having input terminals supplied with the output signals of said array, and a plurality of signal generator output terminals coupled to output terminals of said flip-flops, whereby a plurality of output signals are simultaneously derived from said signal generator output terminals in response to said train of pulse signals.

9. A signal generator according to claim 8, further comprising at least one input flip-flop having an output, and means for supplying the output of said at least one input flip-flop to a part of the input terminals of said array.

10. A signal generator comprising a single input terminal receiving a single train of signals, a counter having a plurality of bits, means for connecting said single output terminal to an input terminal of said counter, said counter generating parallel output signals in response to the inputted single train of signals, an array of a plurality of programmable elements arranged in a matrix form of rows and columns with the programmable elements on respective columns having programmed states which are different from each other, said array performing logic operations based on at least one of AND and OR logic functions with respect to signals applied to the rows thereof to generate a plurality of different output signals at the columns thereof, and means for supplying the rows of said array with the parallel output signals of said counter, wherein a plurality of different output signals are simultaneously derived from said columns of said array in response to said single train of signals received by said single input terminal.

* * * * *

UNITED STATES PATENT AND TRADEMARK OFFICE
CERTIFICATE OF CORRECTION

PATENT NO. : 4,431,926

DATED : February 14, 1984

INVENTOR(S) : HIROSHI MAYUMI

It is certified that error appears in the above-identified patent and that said Letters Patent is hereby corrected as shown below:

Column 2, line 46, after "diagram" delete "showning" insert --showing--.
Column 3, line 28, before "to" insert --correspond--.
Column 4, line 15, before "and", change "f5" to --F5--;
line 39, before "At", change "1." to --"1".)--;
line 51, delete "the Figure" and insert --Fig. 7--.

*Signed and Sealed this*

*Seventeenth* Day of *July 1984*

[SEAL]

Attest:

GERALD J. MOSSINGHOFF

Attesting Officer    Commissioner of Patents and Trademarks